United States Patent [19]

Fajen

[11] 4,190,808
[45] Feb. 26, 1980

[54] AMPLIFIER-OSCILLATOR FREQUENCY MULTIPLIER APPARATUS

[75] Inventor: Lyle A. Fajen, Scottsdale, Ariz.

[73] Assignee: The United States of America as represented by the Secretary of the Air Force, Washington, D.C.

[21] Appl. No.: 889,469

[22] Filed: Mar. 23, 1978

[51] Int. Cl.² .................... H03B 5/36; H03F 3/195
[52] U.S. Cl. .................... 331/59; 330/302; 330/307; 331/76; 331/108 D; 331/116 R; 331/158; 363/159
[58] Field of Search ............... 331/59, 108 D, 116 R, 331/158, 159, 76; 330/302, 307; 363/157, 159

[56] References Cited

U.S. PATENT DOCUMENTS

| | | | |
|---|---|---|---|
| 3,195,070 | 7/1965 | Barditch et al. | 331/76 |
| 4,001,732 | 1/1977 | Gundry | 331/59 X |

Primary Examiner—Siegfried H. Grimm
Attorney, Agent, or Firm—Joseph E. Rusz; William Stephanishen

[57] ABSTRACT

An amplifier-oscillator frequency multiplier apparatus utilizing a pair of servo-connected amplifiers which are electronically switchable to provide either a coherent amplifier or a non-coherent oscillator.

10 Claims, 2 Drawing Figures

AMPLIFIER-OSCILLATOR FREQUENCY MULTIPLIER APPARATUS

STATEMENT OF GOVERNMENT INTEREST

The invention described herein may be manufactured and used by or for the Government for governmental purposes without the payment of any royalty thereon.

BACKGROUND OF THE INVENTION

The present invention relates broadly to frequency multipliers, and in particular to an electronically switchable amplifier-oscillator frequency multiplier apparatus.

In the prior art, the use of amplifiers and oscillators is well known. Basically the amplifier is a device capable of increasing the magnitude of power level of a physical quantity that is varying with time, without distorting the wave shape of the quantity. The great majority of amplifiers are electronic and depend upon transistors or vacuum tubes for their operation. The oscillator is an electronic circuit that converts energy from a direct-current source into a periodically varying electrical output. If the output voltage is a sine-wave function of time, the generator is called a sinusoidal oscillator. There does exist between the amplifier and the oscillator a common denominator in that one type of simple oscillator may be achieved by utilizing an amplifier with its output fed back through a feedback network to the input to cause this circuit to oscillate. The present apparatus provides an amplifier-oscillator apparatus that is electrically switchable to provide either a coherent amplifier or a non-coherent oscillator.

SUMMARY

The present invention utilizes two multi-transistor amplifier stages that are connected in a series configuration. The input to and the feedback around one of the amplifier stages is electronically controlled to provide either straight amplifier operation or feedback amplifier operation in which oscillations are reinforced through the use of a crystal with a predetermined frequency. In one mode, the present apparatus operates as a class A linear amplifier, and in the alternative mode as a non-coherent oscillator.

It is one object of the present invention, therefore to provide a new and improved amplifier-oscillator frequency multiplier apparatus.

It is another object of the invention to provide an improved amplifier-oscillator frequency multiplier apparatus capable of functioning as a coherent amplifier.

It is still another object of the present invention to provide an improved amplifier-oscillator frequency multiplier apparatus capable of functioning as a non-coherent oscillator.

It is yet another object of the invention to provide an improved amplifier-oscillator frequency multiplier apparatus that is electrically switchable to provide either coherent amplifier or non-coherent oscillator operation.

These and other advantages, objects and features of the invention will become more apparent from the following description taken in connection with the illustrative embodiment in the accompanying drawings.

DESCRIPTION OF THE PREFERRED EMBODIMENT

Figure 1:
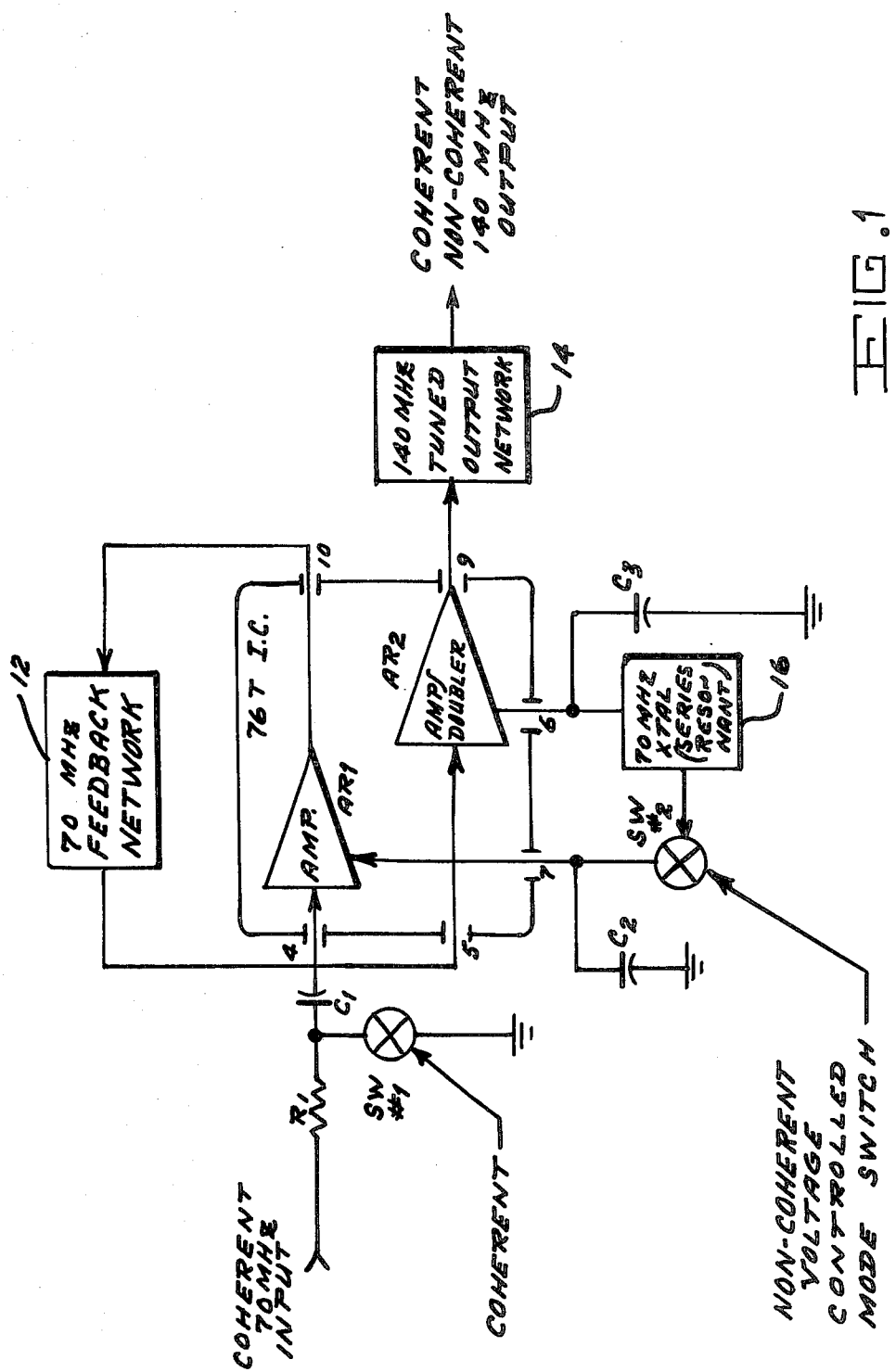
FIG. 1 is a block diagram of the amplifier-oscillator frequency multiplier apparatus in accordance with the present invention, and, FIG. 2 is a schematic diagram of the amplifier-oscillator frequency multiplier apparatus.

Referring now to FIG. 1, there is shown an amplifier-oscillator frequency multiplier apparatus utilizing an integrated circuit 76T which encompasses amplifier, AR1 and amplifier/doubler, AR2. The input 4 of the integrated circuit, 76T is connected respectively to an input circuit comprising in combination resistor R1, capacitor C1 and voltage-controlled mode switch, SW1. The output from amplifier, AR1 is connected via pin 10 to the feedback network, 12. The input pin 5 to amplifier/doubler, AR2 is connected to the output of feedback network 12. The amplifier/doubler, AR2 output is connected to pin 9 and then to a tuned output network 14. The amplifier/doubler, AR2 is connected via pin 6 to crystal 16 which is connected to voltage-controlled mode switch, SW2. The amplifier, AR1 is connected via pin 7 to voltage-controlled switch, SW2. Bypass capacitors C2, C3 are connected respectively between pins 6, 7, and ground.

The circuit shown in FIG. 1 operates in the following manner. The amplifier-oscillator frequency multiplier apparatus which comprises the integrated circuit 76T is made up of two multi-transistor amplifier stages, AR1 and AR2. These two amplifier stages are interconnected as shown in the block diagram. Amplifier AR1 operates as a linear class A RF amplifier and is connected as a common emitter input amplifier when the circuit is switched to amplify coherent signals. The amplifier AR1 is connected as a common base input amplifier when the circuit is switched to and operated as a non-coherent oscillator. The amplifier/doubler AR2 is operating as a non-linear multiplier for even order harmonics, because it is driven into its non-linear operating point. The amplifier-doubler AR2 also supplies a linear, low impedance feedback output when the circuit is switched to and operates as a non-coherent oscillator.

The operation of the amplifier oscillator frequency multiplier as a coherent amplifier multiplier is achieved by opening switch, SW1 and allowing a signal to pass from the 70 MHz input, through capacitor C1, to amplifier AR1. Switch SW 2 is also open, thus removing the crystal 16 from the previous feedback path. Capacitor C2 and C3 will become simple emitter bypass capacitors. With the feedback path through the crystal 16 open and with capacitor C1 disconnected from ground, amplifier AR1 becomes a common emitter amplifier for the input coherent 70 MHz signal. The signal path continues out of pin 10; through the 70 MHz feedback network 12 into pin 5 which is the amplifier/doubler AR2 input. The amplifier/doubler AR2 works as a common emitter amplifier/multiplier, producing a coherent output level of 0 dBm at 140 MHz with a coherent input level of −10 dBm.

The operation of the amplifier-oscillator frequency multiplier as a non-coherent oscillator multiplier is achieved by closing switch, SW1 to short capacitor C1 and resistor R1 to ground. Consider switch SW2 is closed shorting the 70 MHz crystal 16 to amplifier AR1.

Capacitors C2 and C3 tune the emitters of amplifiers AR1 and AR2 to act as resistive ports. Sufficient gain is available in the feedback loop starting at pin 7, through amplifier AR1 (common base amplifier) out of pin 10 and continuing through the 70 MHz feedback network 12 into pin 5; out of pin 6 through the 70 MHz crystal 16, and returning to the origin in phase to cause regeneration. The amplifier/doubler, AR2, amplifies and multiplies this signal to an output level of about 0 dBm at 140 MHz. Thus achieving non-coherent oscillator operation.

Figure 2:
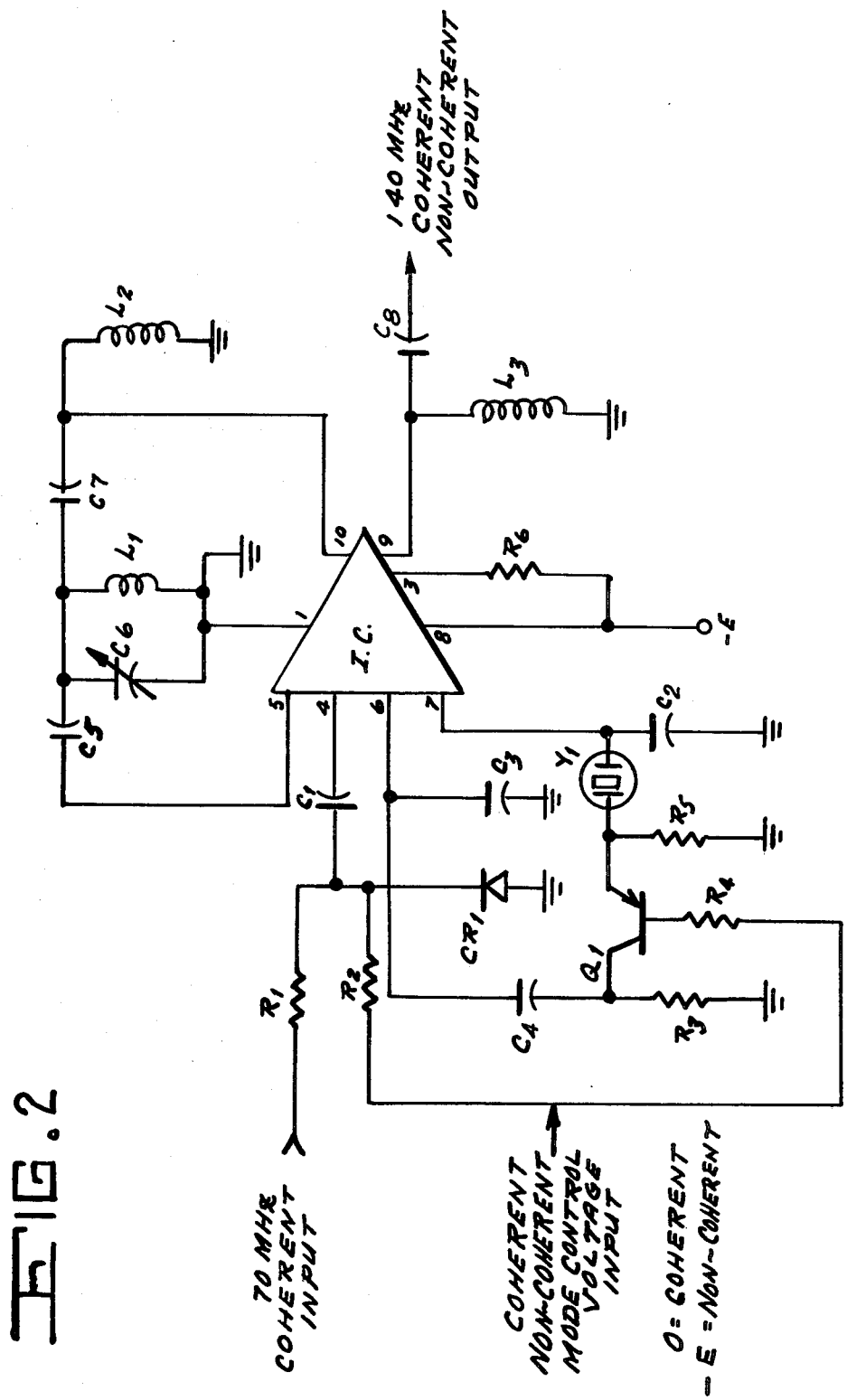

Referring now to FIG. 2, there is shown a schematic diagram of the amplifier-oscillator frequency multiplier apparatus. In the present figure switch, SW1 is implemented by diode, CR1, and switch, SW2 is implemented by transistor, Q1. The 70 MHz feedback network 12 of FIG. 1 comprises capacitors, C5, C6, C7 and inductors, L1, L2. The 140 MHz tuned output network, 14 of FIG. 1 is implemented by capacitor C8 and inductor L3. Resistor, R1 and capacitors, C1, C2, and C3 are shown as in FIG. 1.

Although the invention has been described with reference to a particular embodiment, it will be understood to those skilled in the art that the invention is capable of a variety of alternative embodiments within the spirit and scope of the appended claims.

I claim

1. An amplifier-oscillator frequency multiplier apparatus comprising in combination:
    a first amplifier means having a first and second input and an output,
    a second amplifier means having an input and a first and second output,
    a feedback means operating at a first predetermined frequency, said feedback means being connected from said output of said first amplifier means to said input of said second amplifier means
    a first switch means connected from said first input of said first amplifier means to ground, said first switch means having a first and second state,
    a second switch means connected to said second input of said first amplifier means, said second switch means having a first and second state,
    a crystal connected from said second output of said second amplifier means to said second switch means, said crystal operating at a predetermined frequency, and
    an output network connected to said first output of said second amplifier means, said output network operating at a predetermined frequency.

2. An amplifier-oscillator frequency multiplier apparatus as described in claim 1 wherein said first and second switch means are in said first state to provide coherent amplifier multiplier operation.

3. An amplifier-oscillator frequency multiplier apparatus as described in claim 1 wherein said first and second switch means are in said second state to provide a non-coherent oscillator multiplier operation.

4. An amplifier-oscillator frequency multiplier apparatus as described in claim 1 wherein said first and second amplifier means comprises an integrated circuit having two-multi-transistor amplifier stages.

5. An amplifier-oscillator frequency multiplier apparatus as described in claim 1 wherein said first predetermined frequency of said feedback network is 70 MHz.

6. An amplifier-oscillator frequency multiplier apparatus as described in claim 1 wherein said predetermined frequency of said crystal is 70 MHz.

7. An amplifier-oscillator frequency multiplier apparatus as described in claim 1 wherein said first switch means comprises a diode.

8. An amplifier-oscillator frequency multiplier apparatus as described in claim 1 wherein said second switch means comprises a transistor.

9. An amplifier-oscillator frequency multiplier apparatus as described in claim 1 wherein said predetermined frequency of said output network is 140 MHz.

10. An amplifier-oscillator frequency multiplier apparatus as described in claim 1 wherin said first state of said first and second switch means is an open circuit, and said second state of said first and second switch means is a short circuit.

* * * * *